United States Patent
Moronuki

(10) Patent No.: US 10,036,472 B2
(45) Date of Patent: Jul. 31, 2018

(54) SLIDING MEMBER AND PISTON RING

(71) Applicant: KABUSHIKI KAISHA RIKEN, Chiyoda-ku, Tokyo (JP)

(72) Inventor: Masaki Moronuki, Chiyoda-ku (JP)

(73) Assignee: KABUSHIKI KAISHA RIKEN, Chiyoda-ku, Tokyo (JP)

( * ) Notice: Subject to any disclaimer, the term of this patent is extended or adjusted under 35 U.S.C. 154(b) by 0 days.

(21) Appl. No.: 15/736,392

(22) PCT Filed: Feb. 28, 2017

(86) PCT No.: PCT/JP2017/007976
§ 371 (c)(1),
(2) Date: Dec. 14, 2017

(87) PCT Pub. No.: WO2017/150571
PCT Pub. Date: Sep. 8, 2017

(65) Prior Publication Data
US 2018/0187781 A1 Jul. 5, 2018

(30) Foreign Application Priority Data
Mar. 4, 2016 (JP) .................. 2016-042606

(51) Int. Cl.
*F16J 9/26* (2006.01)
*F16C 33/12* (2006.01)
(Continued)

(52) U.S. Cl.
CPC .......... *F16J 9/26* (2013.01); *B32B 15/18* (2013.01); *C23C 14/0611* (2013.01); *F02F 5/00* (2013.01);
(Continued)

(58) Field of Classification Search
CPC ........ F16J 9/26; F06C 33/121; F16C 2206/04; F02F 5/00; C23C 14/0611; C23C 16/0227; B32B 15/18
(Continued)

(56) References Cited

U.S. PATENT DOCUMENTS 9,523,146 B1 * 12/2016 Lin ................ C23C 14/0664
2015/0240944 A1 * 8/2015 Ivanov ............ C23C 28/042
277/443
(Continued)

FOREIGN PATENT DOCUMENTS

| JP | S479761 A | 5/1972 |
|---|---|---|
| JP | 2009167512 A | 7/2009 |

(Continued)

OTHER PUBLICATIONS

Jul. 11, 2017, Decision to Grant a Patent issued by the Japan Patent Office in the corresponding Japanese Patent Application No. 2017-530364.
(Continued)

*Primary Examiner* — Marguerite McMahon
(74) *Attorney, Agent, or Firm* — Kenja IP Law PC

(57) ABSTRACT

Provided is a sliding member capable of achieving excellent wear resistance and high coating adhesion under harsh sliding conditions without subjecting a base member to nitriding treatment. The sliding member includes a base member made of a steel material and a hard coating that is formed on the base member and having a surface serving at least as a sliding surface. The hard coating has a Young's modulus having a distribution to increase first in a depth direction directed from an interface between the hard coating and the base member to the surface, to become maximum at a predetermined depth, and then to decrease in the depth direction directed from the interface to the surface.

12 Claims, 3 Drawing Sheets

(51) Int. Cl.
*F02F 5/00* (2006.01)
*C23C 14/06* (2006.01)
*B32B 15/18* (2006.01)
*C23C 16/02* (2006.01)

(52) U.S. Cl.
CPC ........ *F16C 33/121* (2013.01); *C23C 16/0227* (2013.01); *F16C 2206/04* (2013.01)

(58) Field of Classification Search
USPC ...................................................... 123/193.6
See application file for complete search history.

(56) References Cited

U.S. PATENT DOCUMENTS

| | | | | |
|---|---|---|---|---|
| 2015/0252901 A1* | 9/2015 | Kennedy | ................... | C23C 4/06 |
| | | | | 277/444 |
| 2015/0292622 A1* | 10/2015 | Kennedy | ............. | C23C 14/0605 |
| | | | | 277/442 |
| 2015/0307998 A1 | 10/2015 | Ahn et al. | | |
| 2015/0308573 A1* | 10/2015 | Sato | .......................... | F02F 5/00 |
| | | | | 277/443 |
| 2016/0341312 A1* | 11/2016 | Kennedy | ............... | C23C 28/321 |

FOREIGN PATENT DOCUMENTS

| | | | |
|---|---|---|---|
| JP | 2013155420 A | 8/2013 | |
| JP | 2015086967 A | 5/2015 | |
| JP | 2015517686 A | 6/2015 | |

OTHER PUBLICATIONS

May 23, 2017, International Search Report issued in the International Patent Application No. PCT/JP2017/007976.

\* cited by examiner

SLIDING MEMBER AND PISTON RING

TECHNICAL FIELD

The disclosure relates to a sliding member and, more particularly, to a sliding member of an automobile part that is required to have high reliability.

BACKGROUND

It has been prevalent to increase wear resistance of a sliding member such as a piston ring by nitriding and hardening a surface (a sliding surface) of a base member made of a steel material such as SUS440B, SWOSC-V, SUP and the like and then applying a hard coating to the surface. Examples of the hard coating include amorphous carbon called diamond-like carbon (DLC). A structure of the DLC, in essence, is a mixture of diamond bond ($SP^3$ bond) and graphite bond ($SP^2$ bond) as carbon bond. Having hardness, wear resistance, thermal conductivity, chemical stability that are similar to diamond as well as solid lubricity similar to graphite, the DLC is suitable as a protection film of a sliding member of, for example, an automobile part.

However, a piston ring for a downsizing turbo charged engine with improved fuel efficiency for environmental conservation is used in a very severe sliding environment with high temperature and a high surface pressure. As such, conventional piston rings reach high temperature, accelerating wear thereof. In order to effectively dissipate heat in a combustion chamber from a piston to a cylinder wall surface via the piston ring, the piston ring needs to have high thermal conductivity. Therefore, materials having high thermal conductivity have been used for a base member to ensure wear resistance.

There are various hard coatings that have been developed. For example, patent literature PLT1 set forth below describes a DLC coating applied to a sliding side surface of a sliding member. This DLC coating includes at least two films, a lower film and an upper film, both made of the DLC. The lower film has a hardness of 20 GPa to 45 GPa and Young's modulus of 250 GPa to 450 GPa, while the upper film has a hardness of 5 GPa to 20 GPa and the Young's modulus of 60 GPa to 240 GPa.

CITATION LIST

Patent Literature

PLT 1: JP 2009-167512 A

SUMMARY

Technical Problem

However, the nitriding treatment and the like of a base member made of a material having high thermal conductivity considerably lowers the thermal conductivity of the base member, inhibiting sufficient wear resistance of the base member to withstand the severe sliding conditions as described above. However, forming conventional hard coating films as those disclosed in the PLT 1 on the base member that is made of the material having high thermal conductivity without nitriding treatment for the purpose of maintaining the thermal conductivity thereof causes a problem of coating adhesion that, when sludge in lubrication oil is caught by the sliding surface during sliding, the hard coating chips due to plastic deformation of the base member and peeling the hard coating off. For this reason, conventional techniques are not good enough to achieve both the wear resistance and the coating adhesion to withstand the severe sliding conditions as described above.

Therefore, it could be helpful to provide a sliding member and a piston ring that are capable of achieving excellent wear resistance and high coating adhesion under the severe sliding conditions without subjecting the base member to the nitriding treatment.

Solution to Problem

As a result of our diligent studies, we have found that a base member that is made of a steel material having a high thermal conductivity of at least 30 W/m·K and having a hard coating formed thereon having a specific distribution of Young's modulus in a depth direction thereof may achieve excellent wear resistance and coating adhesion without subjecting the base member to nitriding treatment.

The disclosure is invented on the basis of this knowledge and is summarized as follows.

(1) A sliding member includes:
a base member made of a steel material; and
a hard coating formed on the base member and having a surface serving at least as a sliding surface,
wherein the hard coating has a Young's modulus having a distribution to increase first in a depth direction directed from an interface between the hard coating and the base member to the surface, to become maximum at a predetermined depth, and then to decrease in the depth direction directed from the interface to the surface.

(2) In regard to the sliding member of the above (1), the hard coating includes a first coating, a second coating, a third coating, a fourth coating, and a fifth coating formed in the mentioned order from the interface to the surface. The first and fifth coatings each have a constant Young's modulus within a range of 150 GPa to 250 GPa. The third coating has a constant Young's modulus within a range of 400 GPa to 600 GPa. The second coating has a Young's modulus having a distribution to gradually increase from the Young's modulus of the first coating toward the Young's modulus of the third coating. The fourth coating has a Young's modulus having a distribution to gradually decrease from the Young's modulus of the third coating toward the Young's modulus of the fifth coating.

(3) In regard to the sliding member of the above (2), with respect to a total thickness of the hard coating, a total thickness of the first coating and the second coating is 10% or more and less than 40%, a thickness of the third coating is 10% or more and less than 40%, and a total thickness of the fourth coating and the fifth coating is at least 50%.

(4) In regard to the sliding member of the above (2) or (3), each of the first to fifth coatings is an amorphous hard carbon film that is substantially free from hydrogen.

(5) In regard to the sliding member of the above (2) or (3), the first coating is made of metal nitride, and each of the second to fifth coatings is an amorphous hard carbon film that is substantially free from hydrogen.

(6) In regard to the sliding member of the above (1), the Young's modulus of the hard coating continuously varies from the interface to the surface.

(7) In regard to the sliding member of the above (6), the hard coating is an amorphous hard carbon film that is substantially free from hydrogen.

(8) In regard to the sliding member of any one of the above (1) to (7), the steel material of the base member has a thermal conductivity of at least 30 W/m·K.

(9) In regard to the sliding member of any one of the above (1) to (8), a Young's modulus of the base member is 150 GPa to 250 GPa and smaller than the Young's modulus of the hard coating at the interface.

(10) In regard to the sliding member of any one of the above (1) to (9), a total thickness of the hard coating is 3 μm to 30 μm.

(11) The sliding member of any one of the above (1) to (10) further includes an intermediate layer composed of one or more elements selected from the group consisting of Cr, Ti, Co, V, Mo, Si and W, or a carbide thereof, between the base member and the hard coating.

(12) A piston ring including the sliding member of any one of the above (1) to (11) has an outer peripheral surface serving as the sliding surface.

Advantageous Effect

A sliding member and a piston ring of the disclosure are capable of achieving excellent wear resistance and high coating adhesion under severe sliding conditions without subjecting the base member to nitriding treatment.

DETAILED DESCRIPTION (Sliding Member)

Figure 1A:
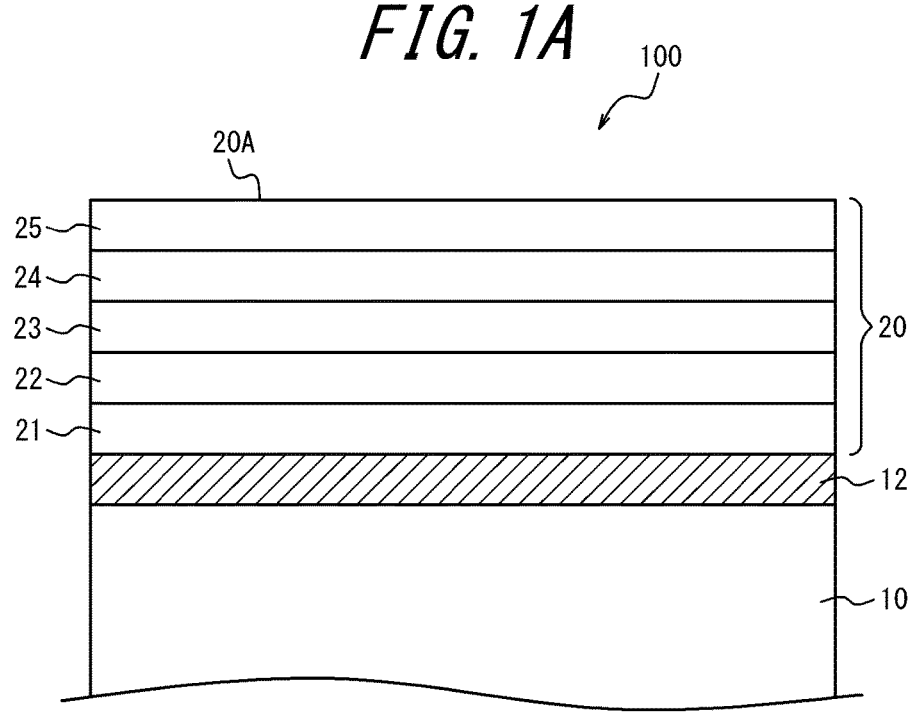
FIG. 1A is a schematic cross-sectional view of a sliding member 100 according to one embodiment.
Figure 2A:
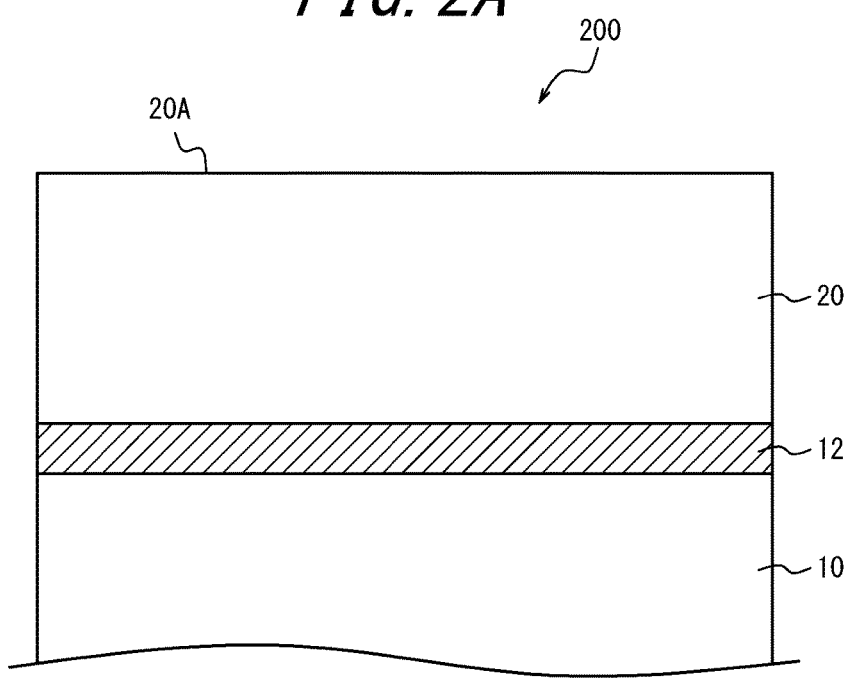
FIG. 2A is a schematic cross-sectional view of a sliding member 200 according to another embodiment.

Referring to FIG. 1A and FIG. 2A, sliding members 100 and 200 of one embodiment will be described. The sliding members 100 and 200 are used in the existence of a lubricant oil and each include a base member 10, an intermediate layer 12 formed on the base member 10, and a hard coating 20 formed on the intermediate layer 12 and having a surface serving at least as a sliding surface 20A.

(Base Member)

According to the present embodiment, the base member 10 is made of a steel material having a thermal conductivity of at least 30 W/m·K. Examples of such a steel material include spring steel such as SUP9 (38.6 W/m·K) and SUP10 (38.0 W/m·K) and silicon chrome steel such as SWOSC-V (31.4 W/m·K). When the steel material forming the base member has a thermal conductivity of under 30 W/m·K, the sliding member reaches high temperature under severe sliding environment of high temperature and high surface pressure, failing to secure wear resistance. An upper limit of the thermal conductivity of the steel material is not limited.

A surface of the base member 10 is not subjected to nitriding treatment. According to the present embodiment, as described below, the base member 10 may achieve excellent wear resistance and coating adhesion without being subjected to the nitriding treatment. Therefore, subjecting the base member to the nitriding treatment considerably lowers the thermal conductivity of the base member, inhibiting sufficient wear resistance of the base member to withstand the severe sliding conditions as described above.

A Young's modulus of the base member 10 is preferably 150 GPa to 200 GPa, more preferably 180 GPa to 220 GPa. With the Young's modulus under 150 MPa, the base member becomes greatly deformed upon application of a load thereto and thus is likely to separate from the hard coating 20 at an interface between the hard coating 20 and the base member 10. The Young's modulus over 250 MPa, on the other hand, impairs spring properties necessary for a piston ring. Further, the Young's modulus of the base member 10 is preferably smaller than the Young's modulus of the hard coating 20 at the interface.

(Intermediate Layer)

The intermediate layer 12 is formed between the base member 10 and the hard coating 20 and has a function to enhance adhesion therebetween by reducing stress at the interface. To exert this function, the intermediate layer 12 is preferably composed of one or more elements selected from the group consisting of Cr, Ti, Co, V, Mo, Si and W, or a carbide thereof. A thickness of the intermediate layer 12 is preferably 0.1 μm to 0.6 μm, more preferably 0.2 μm to 0.5 μm. With the thickness of less than 0.1 μm, the intermediate layer 12 may not sufficiently function to enhance the adhesion of the hard coating 20. With the thickness over 0.6 μm, on the other hand, the intermediate layer 12 is likely to undergo plastic flow during sliding and to be peeled off.

The intermediate layer 12 may be formed by, for example, sputtering. The base member 10 after being washed is placed in a vacuum chamber of a PVD coating system. Then, the sputtering discharge of a target is performed while Ar gas is introduced, thus forming the intermediate layer 12. The target may be selected from Cr, Ti, Co, V, Mo, Si, and W. The thickness of the intermediate layer 12 may be adjusted by changing discharging time of a metal target.

(Hard Coating)

According to the present embodiment, it is important that the hard coating 20 has a Young's modulus having a distribution to increase first in a depth direction directed from the interface to a surface of the hard coating 20, to become maximum at a predetermined depth, and then to decrease in the depth direction directed from the interface to the surface.

Figure 1B:
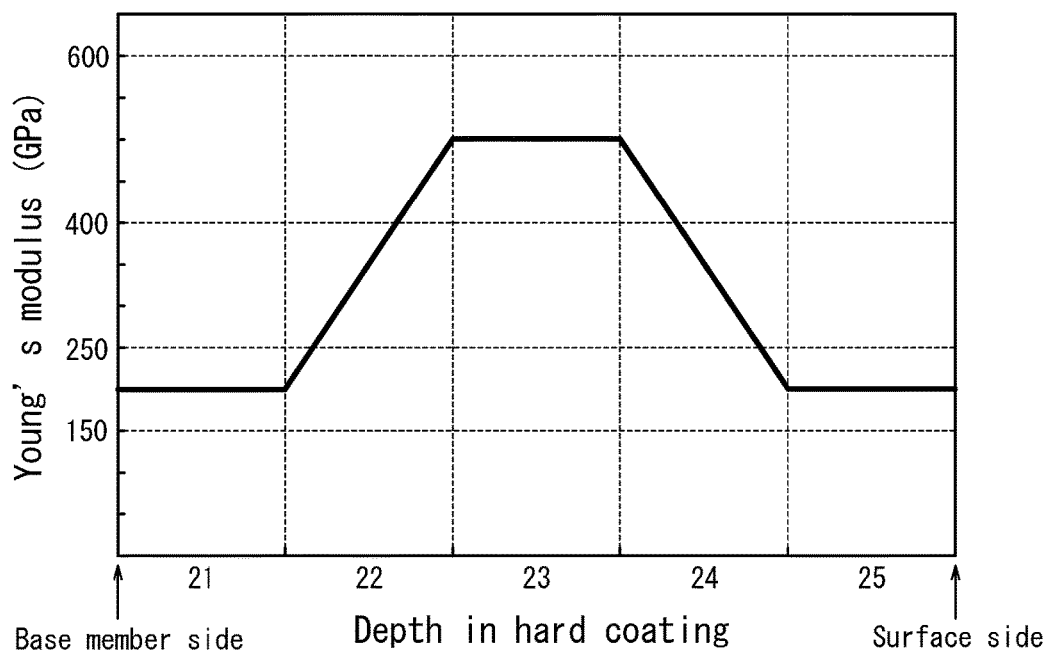
FIG. 1B is a graph illustrating an example of a distribution of a Young's modulus of a hard coating of FIG. 1A.

In one example of the distribution of the Young's modulus in the depth direction, as illustrated in FIG. 1 (B), the hard coating 20 is made up of a first coating 21, a second coating 22, a third coating 23, a fourth coating 24, and a fifth coating 25, in the mentioned order from the interface to the surface. Here, preferably, the first coating 21 and the fifth coating 25 each have a constant Young's modulus in a range of 150 to 250 GPa, and the third coating 23 has a constant Young's modulus in a range of 400 to 600 GPa. Also, preferably, the second coating 22 has a distribution of a Young's modulus to gradually increase from the Young's modulus of the first coating 21 toward the Young's modulus of the third coating 23, and the fourth coating 24 has a distribution of a Young's modulus to gradually decrease from the Young's modulus of the third coating 23 toward the Young's modulus of the fifth coating 25. The Young's modulus of the second and fourth coatings 22 and 24 may or may not vary in a linear manner as illustrated in FIG. 1B, or may vary either continuously or in a stepwise manner.

Each of the coatings has a function and effect as follows. First, having a relatively small Young's modulus of 150 GPa to 250 GPa, which is not greatly different from the Young's modulus of the base member 10, the first coating 21 may reduce distortion of the base member 10 at the interface upon application of external force and prevent peeling of the coating from the interface. Second, having the Young's modulus that gradually varies, the second coating 22 may prevent delamination of the first coating 21 and the third coating 23 from each other. Having a relatively large Young's modulus of 400 GPa to 600 GPa, the third coating 23 may minimize distortion upon application of external force to the hard coating 20 in its entirety. Having the Young's modulus that gradually varies, the fourth coating 24 may prevent delamination of the third coating 23 and the fifth coating 25 from each other. Lastly, having a relatively small Young's modulus of 150 GPa to 250 GPa, the fifth coating 25 serving as a wear-resistant layer may reduce chipping and peeling and may more smoothly slide at the start of sliding.

Here, with respect to a total thickness of the hard coating 20, a total thickness of the first coating 21 and the second coating 22 is preferably 10% or more and less than 40%, a thickness of the third coating 23 is preferably 10% or more and less than 40%, and a total thickness of the fourth coating 24 and the fifth coating 25 is at least 50%. When the total thickness of the first coating 21 and the second coating 22 is less than 10%, the adhesion to the base member 10 becomes deteriorated. Also, when the total thickness of the first coating 21 and the second coating 22 is 40% or more, the wear resistance of the hard coating 20 in its entirety becomes deteriorated. When the thickness of the third coating 23 is less than 10%, rigidity of the hard coating 20 in its entirety cannot be enhanced and, when this thickness is 40% or more, the rigidity of the hard coating 20 in its entirety becomes excessive, causing peeling within a layer. Further, when the total thickness of the fourth coating 24 and the fifth coating 25 is less than 50%, sufficient durability cannot be secured.

The hard coating 20 preferably has a thickness of 3 μm to 30 μm in its entirety. When this thickness is less than 3 μm, durability necessary to slide against a mating material cannot be secured. When this thickness is more than 30 problems such as chipping and peeling occur due to internal stress of the coating.

Preferably, each of the first to fifth coatings 21 to 25 is made of amorphous hard carbon (DLC) alone that is substantially free from hydrogen. Whether it is amorphous carbon may be determined by conducting Raman spectrum measurement using a Raman spectrophotometer (Ar laser). Note that "substantially free from hydrogen" used herein means that the hydrogen content of the coatings determined by an HFS (Hydrogen Forward Scattering) analysis is 10 atm % or less, with the rest substantially consisting of carbon. The hydrogen content is preferably 5 atm % or less.

The amorphous hard carbon film may be formed by employing a PVD method such as ion plating. The PVD method may form an amorphous carbon film having high hardness with little hydrogen content and also having excellent wear resistance.

Here, the Young's modulus of the amorphous hard carbon film in the hard coating 20 may be controlled by adjusting a bias voltage applied to the base member 10 when using an ion plating method to perform vacuum arc discharge to a carbon target. More specifically, increasing the bias voltage increases kinetic energy of carbon ions colliding with the base member, causing the carbon to be bounced off the surface of the base member by sputtering without being deposited thereon. A resulting amorphous hard carbon film has a rough structure and a small Young's modulus. The Young's modulus becomes maximum when the bias voltage is −80 V to 120 V.

According to the present embodiment, the first coating 21 may be made of metal nitride, while the second to fifth coatings 22 to 25 may each be an amorphous hard carbon film that is substantially free from hydrogen. The metal nitride may include, for example, CrN and TiN.

Figure 2B:
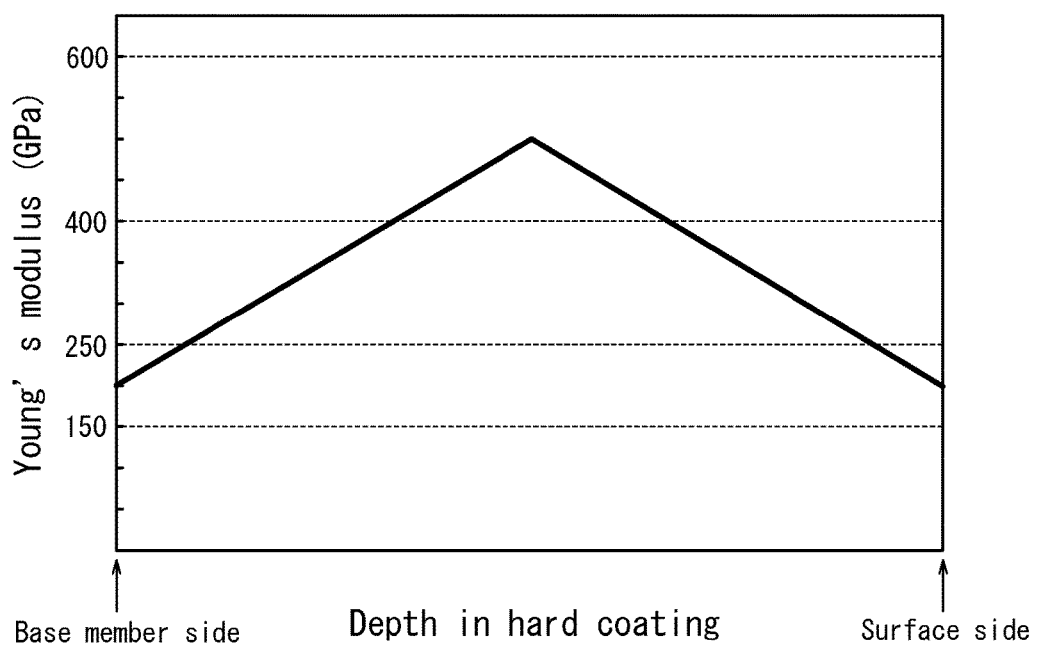
FIG. 2B is a graph illustrating an example of a distribution of a Young's modulus of a hard coating of FIG. 2A.

In another example of the distribution of the Young's modulus distribution in the depth direction, as illustrated in FIG. 2B, the hard coating 20 may have the Young's modulus that continuously varies from the interface between the hard coating 20 and the base member 10 to the surface of the hard coating 20. The Young's modulus of the hard coating 20 may or may not vary in a linear manner as illustrated in FIG. 2B.

Here, the Young's modulus of the hard coating 20 at the interface and at the surface is preferably 150 GPa to 250 GPa, and a maximum Young's modulus of the hard coating 20 in the depth direction is preferably 400 GPa to 600 GPa. Also, the Young's modulus of the hard coating 20 becomes maximum at a depth in a range of 33% to 56% of the total thickness from the interface. With this depth in a range of less than 33%, the adhesion to the base member becomes deteriorated and, with this depth in a range over 56%, the adhesion strength to the base member is reduced and cause delamination.

In this example also, the total thickness of the hard coating 20 is preferably 3 μm to 30 μm. In this example, further, the hard coating 20 is preferably the amorphous hard carbon film that is substantially free from hydrogen.

According to the present embodiment, as described above, when the base member 10 is made of the steel material having the thermal conductivity of at least 30 W/m·K and has the hard coating formed thereon having the Young's modulus in the depth direction as described above, the sliding member may achieve excellent wear resistance and adhesion without having surface modification treatment of the base member 10 such as nitriding.

(Piston Ring)

Figure 3:
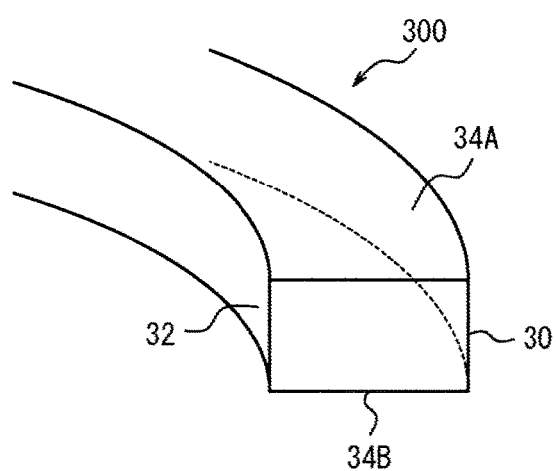
FIG. 3 is a cross-sectional perspective view of a piston ring 300 according to one embodiment.

Referring to FIG. 3, a piston ring 300 according to one embodiment of the disclosure includes the sliding member 100 as described above or a sliding member 200 and has an outer peripheral surface 30 having a laminating structure made up of the hard coating as illustrated in FIGS. 1A and 1B, or 2A and 2B. With this structure, the outer peripheral surface 30, which serves as the sliding surface, may have excellent wear resistance and coating adhesion under severe sliding conditions.

The sliding member 100 according to one embodiment of the disclosure is applicable to various products including, in addition to the piston ring, a valve lifter, a vane, a rocker arm, and a seal ring.

Examples

On an outer peripheral surface of piston rings made up of base members as illustrated in Table 1, the intermediate layer and the amorphous hard carbon film as illustrated in the Table 1 were formed under conditions as described below.

A material of the base member, surface treatment, the Young's modulus, and the thermal conductivity of each example are illustrated in the Table 1.

The intermediate layer was formed in the following manner: a piston ring body (the base member) was subjected to ultrasonic cleaning with acetone and isopropyl alcohol and placed in the vacuum chamber of the PVD coating apparatus. Then, while Ar gas was being introduced, sputtering discharge of the metal target was performed. The metal target was Cr. A thickness of the intermediate layer illustrated in the Table 1 was adjusted by changing discharging time of the metal target.

Subsequent to the formation of the intermediate layer, an amorphous hard carbon film that was substantially free from hydrogen was formed in the same chamber. The amorphous hard carbon film was formed by vacuum arc discharge of the carbon target, and a distribution of the Young's modulus as illustrated in the Table 1 was obtained by adjusting the bias voltage applied to the piston ring during the arc discharge. A thicknesses of the amorphous hard carbon film is also illustrated in the Table 1.

(Measurement of Young's Modulus of Hard Carbon Film)

The Young's modulus of the hard carbon film was measured in conformity with ISO 14577-1 (instrumented indentation hardness test) using an ultra microhardness tester and a Berkovich indenter under a condition of test force of 9.8 mN. A measurement part was located near a surface of the hard carbon film and subjected to spherical surface polishing with a steel ball having a diameter of 30 mm coated with diamond paste having an average particle size of 0.25 μm. The Young's modulus was calculated from a load versus indentation depth curve.

(Measurement of Thermal Conductivity of Base Member)

For measurement of the thermal conductivity, a measurement sample with a thickness of 1 mm was cut out from a material having a diameter of 5 mmφ, and the measurement sample was polished and then measured three times by a laser flash method. Mean value of three measured values is used as the thermal conductivity.

(Evaluation)

Reciprocating sliding test was conducted using piston ring pieces of the examples and comparative examples and a mating material made of SUJ2 (JIS G 4805). Then, the coating adhesion (peeling resistance) and the wear resistance (durability) were evaluated.

(Evaluation Method of Coating Adhesion)

OW-20 engine oil was applied to the mating material, and the mating material was heated at 80° C. Then, a load of 300 N was applied to the piston ring piece to push the piston ring piece against the mating material and, in this state, the piston ring was slid in a reciprocating manner at a speed of 50 Hz for 1 hour. After this reciprocating test, the adhesion of a carbon coating was determined based on a situation of sliding marks. Results are illustrated in Table 1.

Evaluation Criteria Include:

Good: In the number of evaluations N=5, no peeling of the carbon coating was occurred, Fair: Out of the number of evaluations N=5, no peeling of the carbon coating was observed in the number of evaluations n≥3, and minor peeling of the carbon coating was observed in the number of evaluations n≤2, and Poor: Out of the number of evaluations N=5, peeling of the carbon coating was observed in the number of evaluations n≥3.

(Evaluation Method of Wear Resistance)

The OW-20 engine oil was applied to the mating material, and the mating material was heated at 80° C. Then, a load of 50 N was applied to the piston ring piece to push the piston ring piece against the mating material and, in this state, the piston ring was slid in a reciprocating manner at a speed of 50 Hz for 6 hours. From the state of sliding marks of the piston ring after this reciprocating slide, a wear amount (a wear depth) of the carbon coating was determined. In the results, "Good" means that a piston ring had a small wear amount, and "Poor" means that the piston ring had a large wear amount, relative to a wear amount of a comparative example 4 set to 1.

TABLE 1

| | Base Member | | | | Intermediate Layer | | Specification of DLC Coating Young's Modulus of Each Coating (GPa) | |
|---|---|---|---|---|---|---|---|---|
| | Material | | Young's Modulus (GPa) | Thermal Conductivity (W/m · K) | Material | Thickness (μm) | #1 | #2 |
| | JIS | Surface Modification Treatment | | | | | | |
| Example 1 | SUP9 | None | 200 | 38.6 | Cr | 0.3 | 150 | Gradual Variation |
| Example 2 | SUP10 | None | 205 | 38.0 | Cr | 0.4 | 200 | Gradual Variation |
| Example 3 | SWOSC-V | None | 196 | 31.4 | Ti | 0.3 | 250 | Gradual Variation |
| Comparative Example 1 | SUS440B | Nitriding Treatment | 200 | 25 | Cr | 0.3 | 250 | |
| Comparative Example 2 | SWOSC-V | Nitriding Treatment | 200 | Less than 30 | Cr | 0.3 | — | — |
| Comparative Example 3 | SUP9 | Nitriding Treatment | 200 | 29.8 | Ti | 0.3 | 250 | |
| Comparative Example 4 | SUP10 | Nitriding Treatment | 205 | 29.5 | Cr | 0.3 | — | — |
| Comparative Example 5 | SUP9 | None | 200 | 29.8 | Ti | 0.3 | 250 | |
| Comparative Example 6 | SWOSC-V | Nitriding Treatment | 200 | Less than 30 | Ti | 0.3 | 250 | Gradual Variation |

TABLE 1-continued

| | Specification of DLC Coating | | | | | | | | | Evaluation | |
|---|---|---|---|---|---|---|---|---|---|---|---|
| | Young's Modulus of Each Coating (GPa) | | | Total Thickness | Coating Thickness (μm) Ratio to Total Thickness | | | | | SRV Test (Sludge-containing Oil) | |
| | #3 | #4 | #5 | (μm) | #1 | #2 | #3 | #4 | #5 | Coating Adhesion | Wear Resistance |
| Example 1 | 400 | Gradual Variation | 250 | 10 | 1 10% | 2 20% | 2 20% | 2 20% | 3 30% | Good | Good |
| Example 2 | 500 | Gradual Variation | 200 | 15 | 2 13% | 2 13% | 5 33% | 2 13% | 4 27% | Good | Good |
| Example 3 | 600 | Gradual Variation | 150 | 29 | 2 7% | 4 14% | 8 28% | 8 28% | 7 24% | Good | Good |
| Comparative Example 1 | | 250 | | 5 | | | — | | | Poor | Poor |
| Comparative Example 2 | 300 | — | 200 | 10 | — | — | 5 | — | 5 | Poor | Poor |
| Comparative Example 3 | | 250 | | 5 | | | — | | | Fair | Poor |
| Comparative Example 4 | 300 | — | 200 | 10 | — | — | 5 | — | 5 | Fair | — |
| Comparative Example 5 | | 200 | | 11 | | | — | | | Fair | Poor |
| Comparative Example 6 | 600 | Gradual Variation | 150 | 20 | 2 7% | 3 10% | 6 21% | 4 14% | 5 17% | Fair | Fair |

As can be seen in Table 1, the examples 1 to 3 achieve excellent wear resistance and coating adhesion, while comparative examples 1 to 4 are insufficient in both the wear resistance and the coating adhesion.

INDUSTRIAL APPLICABILITY

The sliding member of the disclosure has the sliding surface formed in a curved surface and is preferably applicable to a piston ring for an internal combustion engine that has surface contact at a high pressure with a cylinder bore during a initial sliding stage. The sliding member of the disclosure is capable of achieving excellent wear resistance and coating adhesion under severe sliding conditions, without having the nitiriding treatment of the base member, and thus may be preferably used as a piston ring for a downsizing turbo charged engine with improved fuel efficiency for environmental conservation.

REFERENCE SIGNS LIST

100, 200 sliding member
10 base member
12 intermediate layer
20 hard coating
21 first coating
22 second coating
23 third coating
24 fourth coating
25 fifth coating
20A sliding surface
300 piston ring
30 outer peripheral surface
32 inner peripheral surface
34A, 34b top and bottom surfaces (top and bottom sides)

The invention claimed is:

1. A sliding member comprising:
a base member made of a steel material; and
a hard coating formed on the base member and having a surface serving at least as a sliding surface,
wherein the hard coating has a Young's modulus having a distribution to increase first in a depth direction directed from an interface between the hard coating and the base member to the surface, to become maximum at a predetermined depth, and then to decrease in the depth direction directed from the interface to the surface.

2. The sliding member according to claim 1, wherein
the hard coating includes a first coating, a second coating, a third coating, a fourth coating, and a fifth coating formed in the mentioned order from the interface to the surface,
the first and fifth coatings each have a constant Young's modulus within a range of 150 GPa to 250 GPa,
the third coating has a constant Young's modulus within a range of 400 GPa to 600 GPa,
the second coating has a Young's modulus having a distribution to gradually increase from the Young's modulus of the first coating toward the Young's modulus of the third coating, and
the fourth coating has a Young's modulus having a distribution to gradually decrease from the Young's modulus of the third coating toward the Young's modulus of the fifth coating.

3. The sliding member according to claim 2, wherein, with respect to a total thickness of the hard coating, a total thickness of the first coating and the second coating is 10% or more and less than 40%, a thickness of the third coating is 10% or more and less than 40%, and a total thickness of the fourth coating and the fifth coating is at least 50%.

4. The sliding member according to claim 2, wherein each of the first to fifth coatings is an amorphous hard carbon film that is substantially free from hydrogen.

5. The sliding member according to claim 2, wherein the first coating is made of metal nitride, and each of the second to fifth coatings is an amorphous hard carbon film that is substantially free from hydrogen.

6. The sliding member according to claim 1, wherein the Young's modulus of the hard coating continuously varies from the interface to the surface.

7. The sliding member according to claim 6, wherein the hard coating is an amorphous hard carbon film that is substantially free from hydrogen.

8. The sliding member according to claim 1, wherein the steel material of the base member has a thermal conductivity of at least 30 W/m·K.

9. The sliding member according to claim 1, wherein a Young's modulus of the base member is 150 GPa to 250 GPa and smaller than the Young's modulus of the hard coating at the interface.

10. The sliding member according to claim 1, wherein a total thickness of the hard coating is 3 μm to 30 μm.

11. The sliding member according to claim 1, comprising an intermediate layer composed of one or more elements selected from the group consisting of Cr, Ti, Co, V, Mo, Si and W, or a carbide thereof, between the base member and the hard coating.

12. A piston ring comprising the sliding member according to claim 1, having an outer peripheral surface serving as the sliding surface.

* * * * *